(12) United States Patent
Wang et al.

(10) Patent No.: US 7,447,616 B2
(45) Date of Patent: Nov. 4, 2008

(54) METHOD AND SYSTEM FOR DEVELOPING A VEHICLE PACKAGE

(75) Inventors: Nanxin Wang, Novi, MI (US); Doug Vandervoort, Novi, MI (US); Jian Wan, Novi, MI (US); Gianna Gomez-levi, Ann Arbor, MI (US); Stephan Sieczka, Brighton, MI (US); Jack Malone, Chelsea, MI (US); David Pulliam, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 322 days.

(21) Appl. No.: 11/161,621

(22) Filed: Aug. 10, 2005

(65) Prior Publication Data

US 2007/0038422 A1 Feb. 15, 2007

(51) Int. Cl.
*G06F 9/455* (2006.01)
(52) U.S. Cl. .............. 703/8; 703/2; 703/22; 703/1; 345/158; 345/156; 345/419; 345/629
(58) Field of Classification Search ............ 703/2, 703/8, 22, 1; 345/158, 156, 771, 419, 629; 705/1; 700/97
See application file for complete search history.

(56) References Cited

U.S. PATENT DOCUMENTS

| | | | |
|---|---|---|---|
| 5,237,250 A | 8/1993 | Zeile et al. | |
| 5,384,704 A | 1/1995 | Snyder et al. | |
| 5,774,969 A | 7/1998 | Zuccato | |
| 6,324,750 B1 | 12/2001 | Saunders et al. | |
| 6,371,766 B1 | 4/2002 | Doll et al. | |
| 6,760,693 B1 | 7/2004 | Singh et al. | |
| 7,079,114 B1 * | 7/2006 | Smith et al. | 345/158 |
| 7,295,959 B2 | 11/2007 | Noma et al. | |
| 2003/0011561 A1 * | 1/2003 | Stewart et al. | 345/156 |
| 2003/0055674 A1 * | 3/2003 | Nishiyama | 705/1 |
| 2003/0132968 A1 * | 7/2003 | Stewart et al. | 345/771 |
| 2004/0148145 A1 * | 7/2004 | Chen et al. | 703/2 |
| 2005/0096885 A1 * | 5/2005 | Rhodes et al. | 703/1 |
| 2005/0200623 A1 * | 9/2005 | Smith et al. | 345/419 |
| 2006/0025983 A1 * | 2/2006 | Arbitter et al. | 703/22 |

(Continued)

OTHER PUBLICATIONS

"Motor Vehicle Dimensions", SAE International, Surface Vehicle Recommended Practice, J1100, Revised Jul. 2002, 68 pages.

(Continued)

*Primary Examiner*—Kandasamy Thangavelu
(74) *Attorney, Agent, or Firm*—Raymond L. Coppiellie; Brooks Kushman P.C.

(57) ABSTRACT

A computer-implemented method for rapidly designing a vehicle package is disclosed. The method receives virtual vehicle package model data, converts the data into mechanical vehicle package model data and transmits the data to a mechanical vehicle package model system. A method is also disclosed for adjusting the mechanical model, converting the adjustment into data readable by a computer aided design system and transmitting the data to the computer aided design system for generating or modifying the virtual vehicle package. A system for designing a vehicle package is disclosed having a mechanical vehicle package model, a computer aided design system, a translator embodied in a computer system in communication with the computer aided design system and a mechanical vehicle package model in communication with the translator.

18 Claims, 7 Drawing Sheets

U.S. PATENT DOCUMENTS

2006/0038812 A1* 2/2006 Warn et al. .................. 345/419
2006/0038832 A1* 2/2006 Smith et al. ................. 345/629
2006/0155402 A1* 7/2006 Read .......................... 700/97

OTHER PUBLICATIONS

Aleixos et al., "Integrated Modeling With Top-Down Approach In Subsidiary Industries", Computers In Industry, vol. 53 (2004) pp. 97-116.

Calkins, D.E., Egging, N. Scholz, C. and Gomez-Levi, G.: AutoDSS: A System Level KBE Tool for Vehicle Product Definition, SAE 2000-01-1351.

Bhise, V., Kridli G., Mamoola, H., Devaraj, S., Pillari, A., Shulze, R.: Development of a Parametric Model for Advanced Vehicle Design, SAE 2004-01-0381.

Wang, N., Becker, B., and Kaepp, G.: PEDSS: A Product Engineering Decision Support System, Proceedings of IMECE 2000, Florida 2000.

Wang. N., Wan, J., Gomze-Levi, G.: A Prametric Approach to Vehicle Seating Buck Design, ASME DETC2004-57212.

Wang, N. Wan, J., and Gomze-Levi, G.: Parametric Method for Applications in Vehicle Design, SAE 05B-201, accepted by SAE World Congress, Apr. 2005.

* cited by examiner

METHOD AND SYSTEM FOR DEVELOPING A VEHICLE PACKAGE

BACKGROUND OF THE INVENTION

1. Field of the Invention

The present invention relates to methods and systems for developing a vehicle package, more particularly to methods and systems that utilize a mechanical vehicle package model.

2. Background Art

Automotive vehicle development is a lengthy process, which requires designing, validating and testing of a vehicle package. The vehicle design may begin with designer drawings, sketches or physical models, such as clay models of conceptual exterior and/or interior designs.

During a subsequent stage, these designs may be represented in a clay physical model, an adjustable vehicle package model, or a computer aided design.

An adjustable physical vehicle package model, often referred to as a "buck" in the industry, assists in developing a vehicle package. The physical model assists in determining an occupant's spacial environment, including overall exterior and interior dimensions and the vehicle's mechanical spacial configuration. It is important in designing a vehicle package to make efficient cost effective allocation of space within the vehicle package. Often times vehicle package design issues may be undetectable until a physical buck is developed. Unlike clay representations, bucks are often adjustable for rapidly making adjustments to overcome design issues or assess package alternatives. Accordingly, adjustable bucks have often been used up front to identify such issues.

Adjustable vehicle bucks also permit validation studies and marketing studies. Multiple occupants representing a range of occupant sizes may be evaluated with the adjustable buck for determining the efficiency, occupant accommodation, ergonomics and/or marketing appeal of a particular vehicle package.

The prior art has offered programmable vehicle models or bucks that incorporate a computer controlling an automated adjustable vehicle buck so that adjustments to the vehicle package may be inputted and adjustments may be made directly to the programmable vehicle model. One such prior art reference is U.S. Pat. No. 6,371,766 B1, which issued to Doll et al. on Apr. 16, 2002, and is incorporated in its entirety by reference herein.

Once a vehicle package has been validated, the vehicle package data is retrieved from either the vehicle package computer or from physical measurements made from the physical vehicle package model. These dimensions are then manually input into a computer aided design (CAD) or a computer aided engineering system (CAE) for generating an electronic vehicle package design. The electronic vehicle package design may have been generated beforehand for performing electronic tests upon the vehicle package. Upon inputting the data from the physical vehicle package, the electronic vehicle package design is either generated or modified from a prior design. At this point, the electronic vehicle package design may be evaluated for various requirements including SAE (Society of Automotive Engineers) design parameters or other design limitations.

If any vehicle package changes are required at the electronic vehicle package design stage, these changes may be input into the programmable vehicle model to assess and validate the modifications in a physical representation. If physical validation unveils any design issues, they may be eliminated with adjustments to the programmable vehicle model. These adjustments are then manually entered into the virtual vehicle package. This cycle continues until the vehicle package is successfully validated in both software and hardware environments.

The process of developing a vehicle package may be both costly and time consuming. The vehicle package requires validation at the physical stage, and may also require validation at the electronic stage. If design issues arise at either stage, the modifications to overcome these issues may require further validation at both the physical and electronic levels. Due to the lack of synergy between both systems, significant time, money and resources are consumed by this process. Additionally, errors may be made in obtaining the data in one system and inputting it into the other system.

A goal of the present invention is to increase the efficiency and workability of a physical vehicle model and the electronic design in the development of a vehicle package.

SUMMARY OF THE INVENTION

An aspect of the present invention is to provide a system for rapidly designing and validating a vehicle package. The system includes an adjustable mechanical vehicle package model for configuring a plurality of vehicle packages that each have one or more vehicle components. A computer aided design system is provided with virtual vehicle package model data for a vehicle package. A translator is in communication with the computer aided design system for converting the virtual vehicle package model data into mechanical vehicle package model data. A mechanical vehicle package model system is in communication with the translator for reading the mechanical vehicle package model data. The mechanical vehicle package model system is in operable communication with the mechanical vehicle package model for adjusting the mechanical vehicle package model to represent the virtual vehicle package model data.

Another aspect of the present invention is to provide a computer implemented method for rapidly designing a vehicle package. The method receives virtual vehicle package model data from a computer aided design system. The virtual vehicle package model data is for a vehicle package that has one or more vehicle components. The vehicle package model data is automatically converted into mechanical vehicle package model data that is readable by a mechanical vehicle package model system for adjusting a mechanical vehicle package model. The mechanical vehicle package model data is transmitted to the mechanical vehicle package model system and the mechanical vehicle package model is adjusted based on the mechanical vehicle package model data.

A further aspect of the present invention is to conduct marketing studies on the mechanical vehicle package model to assess the vehicle package.

Another aspect of the present invention is wherein the method modifies the virtual vehicle package model data with the computer aided design system. The data is automatically converted into modified mechanical vehicle package model data that is readable by the mechanical vehicle package model system for adjusting the mechanical vehicle package model. The modified mechanical vehicle package model data is transmitted to the mechanical vehicle package model system for adjusting the mechanical vehicle package model.

An even further aspect of the present invention is to limit the virtual vehicle package model data modifications to a range of predefined vehicle package dimensions.

An aspect of the present invention is to receive data from the mechanical vehicle package model system to adjust at least one vehicle component. The adjustment data is automatically converted into virtual vehicle package model data readable by the computer aided design system.

A further aspect of the present invention is to simulate modifications to the virtual vehicle package model.

Yet another aspect of the present invention is to transmit the virtual vehicle package model data to the computer aided design system. A virtual vehicle package model is automatically modified to represent adjustments made to the vehicle package model.

An even further aspect of the present invention is wherein the virtual vehicle package model modifications and the adjustments to the mechanical vehicle package model are simultaneous.

Another aspect of the present invention is to export virtual vehicle package model data for at least one vehicle component.

A further aspect is to evaluate the at least one vehicle component from the virtual vehicle package model data.

Another aspect is to fabricate the at least one vehicle component from the virtual vehicle package model data.

Another aspect of the present invention is to conduct physical studies of the mechanical vehicle package model to assess the vehicle package.

An even further aspect of the present invention is to adjust the mechanical vehicle package model to assess adjustments to the vehicle package.

Another aspect of the present invention is to input adjustment data into the mechanical vehicle package model system to adjust at least one of the one or more vehicle components. The vehicle component is automatically adjusted and the adjustment data is automatically converted into virtual vehicle package model data that is readable by the computer aided design system.

Yet another aspect of the present invention is to transmit the virtual vehicle package model data to the computer aided design system.

Another aspect of the present invention is to automatically modify the virtual vehicle package model to represent the adjustments made to the mechanical vehicle package model.

An aspect of the present invention is to provide a computer-implemented method for rapidly designing a vehicle package. A mechanical package buck is adjusted to represent a vehicle package that has one or more vehicle components. The adjustments are automatically converted into virtual vehicle package buck data readable by a computer aided design system. The virtual vehicle package buck data is transmitted to the computer aided design system. A virtual vehicle package is automatically generated to represent the mechanical package buck.

Another aspect of the present invention is wherein adjustment from the mechanical package buck system is received to adjust at least one of the vehicle components. The adjustment data is converted into virtual vehicle package buck data that is readable by the computer aided design system.

An even further aspect of the present invention is to transmit the virtual vehicle package buck data to the computer aided design system, and automatically modify the virtual vehicle package to represent the mechanical package buck adjustments.

The above aspects and other aspects, objects, features, benefits and advantages of the present invention are readily apparent when taken in combination with the accompanying drawings and the detailed description of embodiments of the present invention.

DETAILED DESCRIPTION OF EMBODIMENTS OF THE INVENTION

As required, detailed embodiments of the present invention are disclosed herein; however, it is to be understood that the disclosed embodiments are merely exemplary of the invention that may be embodied in various alternative forms. The Figures are not necessarily to scale, some features may be exaggerated or minimized to show details of particular components. Therefore, the specific structural, architectural, communicative and functional details disclosed herein are not to be interpreted as limiting, but merely as a representative basis for the claims and/or as a representative basis for teaching one skilled in the art to variously employ the present invention.

Figure 1:
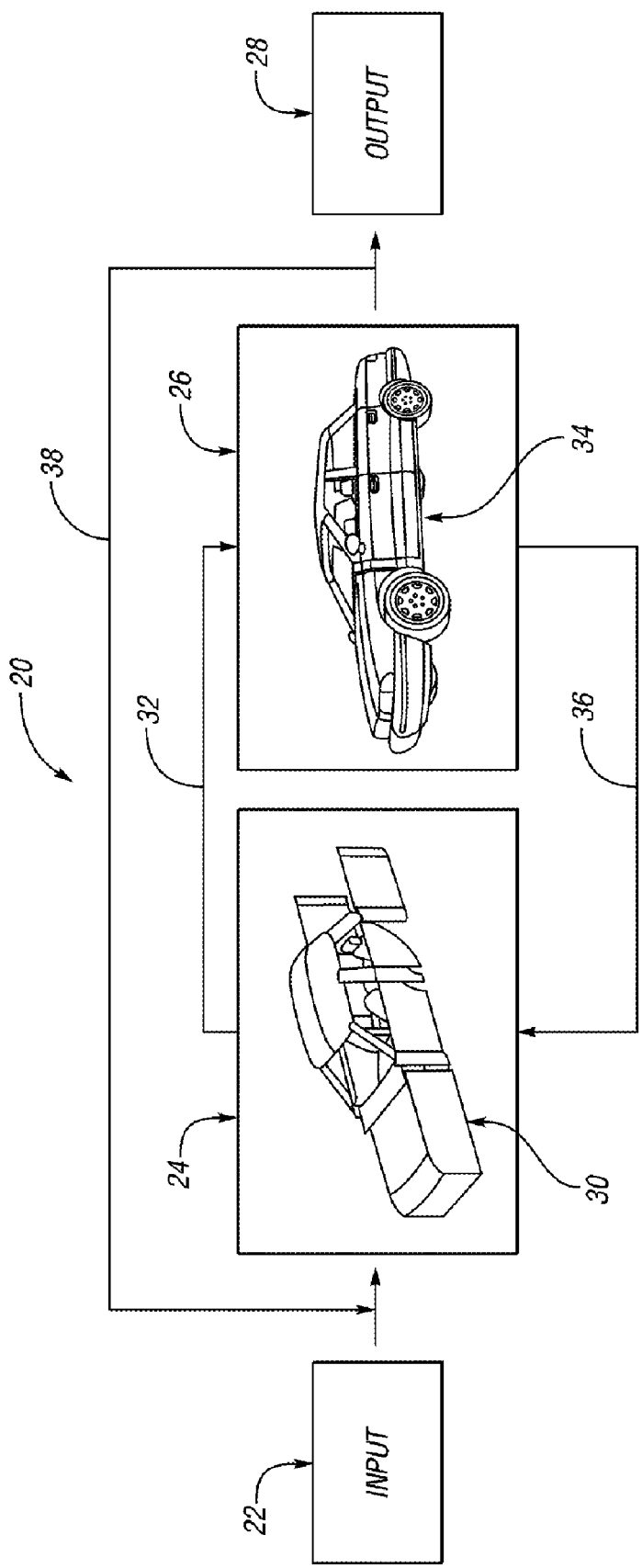
FIG. 1 is a schematic of a system and a computer-implemented method for rapidly designing a vehicle package in accordance with the present invention.

FIG. 1 illustrates a vehicle package development system that is referenced generally by numeral 20. The system 20 includes input criteria 22, software 24, hardware 26 and output data 28. The input criteria 22 includes initial interior targets which may be specific for a desired vehicle program, vehicle program packages, and common studio surfaces for vehicle components. The input criteria 22 is conveyed to the software 24. The software 24 may include a computer aided design (CAD) system or a computer aided engineering (CAE) system for designing and developing a vehicle package or the like. For example, the CAD system may be CATIA. The software 24 may also include an interface, such as a java interface, for communication with the hardware 26.

The software 24 includes a virtual vehicle package model 30, which represents a vehicle package. The virtual vehicle package model 30 illustrated in FIG. 1 represents the interior of the vehicle package. However, the invention contemplates that the virtual vehicle package model 30 may represent any portion of a vehicle package, such as seating, interior panels, exterior panels, various combinations of vehicle portions, or the entire vehicle. Although a vehicle package for a passenger vehicle is depicted, the invention contemplates utilization with development of any product which involves physical interaction with a person, including but not limited to, aircrafts, water crafts, tractors, appliances or the like. Thus, although an interior package of a passenger vehicle is illustrated in the Figures and expressly described within the specification, one having ordinary skill in the art at the time the invention was made will appreciate that various models may be substituted for the exemplary models within the spirit and scope of the invention.

As illustrated by communication line 32, data from the software 24 is transmitted to the hardware 26. The hardware 26 includes a programmable mechanical vehicle package model system 34, which is often referred to as a mechanical buck system. Similarly, the mechanical buck system may represent any portion of a vehicle package, such as interior, exterior, seating, interior/exterior combined or the like.

The present invention may be utilized with any one of various stages of bucks; or the present invention may be utilized for eliminating some of the stages of bucks by simplifying the development of a vehicle package. For example, a buck may include a low-boy table, which is a modeling table for supporting a floor pan that is milled from a material such as wood or plywood. The low-boy table is utilized for modeling clay panels such as an instrument panel, doors, cowl side and stub, A-pillars, floor console, or optional front seats. The low-boy table permits designers to see how various panels and components look and fit together.

A buck may also be a roll-up buck, which includes panels such as the instrument panel, doors and center console formed, by example, from clay. Optionally, a greenhouse may be added which is constructed from wood, fiberglass or another material. The roll-up buck accommodates removable and interchangeable center console and seats. Additional components or compartments can be added to bring in additional rows of seats. The roll-up buck permits designers to view a full seat compartment, or multiple seat compartments in combination. By addition of the greenhouse, the designer may view the full environment.

Another stage of a buck is referred to as a package buck. Often times the package buck is also referred to as an engineering buck, an environmental buck, an occupant buck, or a static seating buck. The package buck is conventionally formed from any of a collection of materials including wood, foam, fiberglass, sheet metal, body-in-white components or the like. The package buck is often dimensionally accurate to a seating package drawing for representing the drawing design. The package buck often includes a full interior and may also include a luggage compartment. The package buck permits designers to evaluate the occupant package, including ingress/egress, head room, vision or the like. Ergonomic checks may also be validated for reach and other spacial relationships. Package evaluation by a program team, customers and/or market research may be performed.

Another buck stage may include an interior market research buck, or glamour buck. This buck may be formed from any materials; often times fiberglass is utilized. The market research buck may be cast from clay interior components from a prior buck stage. Additionally, frame work from design drawings for the roll-up buck may be used for this buck. Generally, in the interior market research buck, the interior is completed to a very high level of detail and finish. The focus of this buck is on the interior and typically little or no exterior evaluation is provided. The interior market research buck may be limited to the region before the B-pillar of the vehicle. Interior market research bucks are generally limited and do not permit easy modification or recycling. The interior market research buck is utilized for gathering customers' views on vehicle design. For example, the interior market research buck readily permits assessment from customers via visualization, without requiring much imagination as prior buck stages may require.

Another stage of a mechanical buck is an inside/outside program property buck. This buck represents a full interior and full exterior with wheels. This buck looks like a real car inside and out and may be formed from body-in-white in combination with fiberglass updates for the fender, hood, grille, or the like. This buck permits full vehicle evaluation for market research and internal review.

Yet another buck is an in-series buck. The in-series buck is formed from a steel box frame construction, generally from the B-pillar. A frame is custom made to fit the property and is set at the curb height of the vehicle package. If the vehicle is a carry over from a past vehicle design, a portion of the body-in-white is used and set at curb position. Interior components may be formed from fiberglass with a high level of fit and finish. Special wood and metal finishes are also used for detailing the components. The in-series buck provides review of interior color and trim themes. This review includes texture of materials and color arrangements of components such as the instrument panel, door panels, console or the like. Separate interior properties for a range of series of vehicles may be evaluated and reviewed with the in-series buck. The in-series buck may be utilized for presenting design intent within the company.

Another buck stage is a color harmony buck. The color harmony buck is a vehicle with program specific components. The buck may be a driveable vehicle and may be able to accept production level parts. The substrate could be sheet metal, wood or other. The purpose of the color harmony buck is for designers to review interior program specific components for color, grain and gloss harmony, in vehicle position, using color corrective lights. The color harmony buck permits the designers to verify that a design intent is met.

Yet another buck stage may include an underhood appearance buck, which represents the components that are typically housed beneath the hood of a vehicle. The underhood appearance buck embodies a portion of a vehicle from a front end clip from a prior program vehicle or surrogate that is filled with components that are made from various materials such as cardboard, foam or rapid prototype materials, in combination with actual or carry-over components. The underhood appearance buck permits designers to evaluate the appearance of the components of the vehicle beneath the hood.

Referring again to FIG. 1, communication line 36 illustrates conveyance of data from the hardware 26 to the software 24. The output data 28 includes demonstrated interior targets, package design and feedback to an associated studio. Communication line 38 represents data that is utilized for adjusting the input data for adjusting the resultant vehicle package.

Unlike prior art systems for developing a vehicle package, the system 20 of the present invention provides direct communication between the software 24 and the hardware 26. Specifically, the hardware 26 is in the loop of the system providing direct feedback through communication line 36 to the software 24. Instead of running the hardware 24 and an electronic design separate in stand alone operations and inputting information from one to the other; the software 24 and the hardware 26 of the present invention operate so that the virtual vehicle package model 30 and the mechanical buck 34 cooperate in tandem. Thus, modifications or developments to the virtual vehicle package model 30 are simultaneously input to the mechanical vehicle package model 34. Likewise, adjustments made to the mechanical vehicle package model 34 are simultaneously incorporated into the virtual vehicle package model 30.

By providing the hardware 26 in loop with the software 24, rapid vehicle package design, development, assessment, ergonomic studies and marketing studies may be conducted early in a vehicle development process. This system 20 enables vehicle program teams to design a vehicle package as a virtual vehicle package model such as the model 30, while simultaneously representing the virtual model 30 with the mechanical buck 34. The mechanical buck 34 may be appraised in the physical environment and design changes, if any, may be imparted directly to the software 24 through communication line 36.

This system 20 permits rapid package ergonomic studies early in the program cycle. The system 20 also reduces evaluation time between development of both the vehicle packages and the design of the vehicle package components. Direct feedback from appraising the mechanical buck 34 is imparted to the software 24. Thus, efficiency is enhanced and design issues are identified and eliminated early in the vehicle package design. Further, difficulties and errors associated with conveying information back and forth between the software 24 and the hardware 26 are eliminated by the system 20 of the present invention which employs the hardware 26 and the software 24 in loop with one another. Additionally, less iterations of buck components are required, thereby providing quicker component surfaces for a vehicle program.

Figure 2:
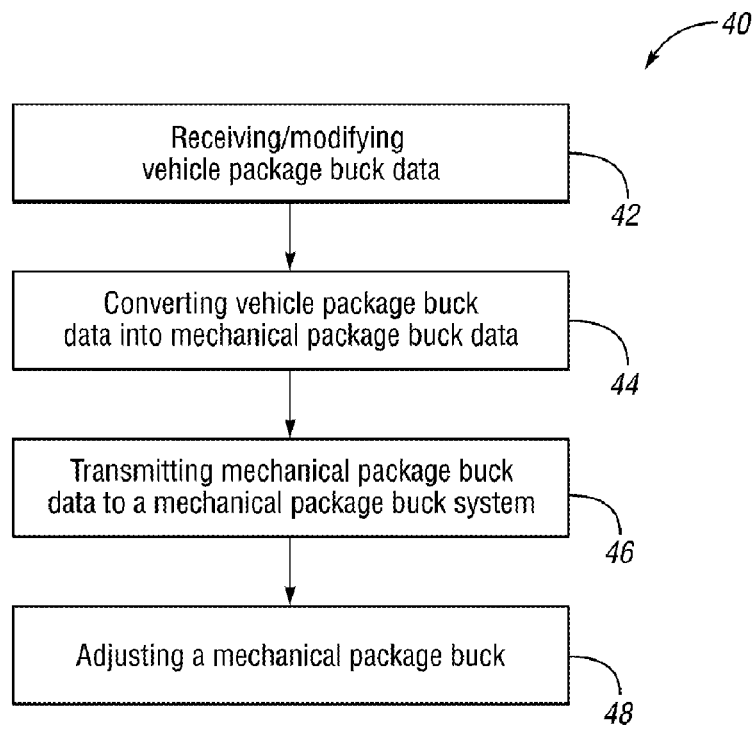
FIG. 2 is a flow chart illustrating a method for designing a vehicle package in accordance with the present invention.

With reference now to FIGS. 1 and 2, a computer implemented method is illustrated for rapidly designing a vehicle package. The method is illustrated in flowchart form in FIG. 2 and is referenced generally by numeral 40. In block 42, vehicle package buck data is received. In block 44, the vehicle package buck data is converted into mechanical package buck data. In block 46, the mechanical package buck data is transmitted to the mechanical package buck system 34. In block 48, a mechanical package buck is adjusted by the mechanical package system based on the mechanical package buck data. Thus, the input 22 is received by the software 24, converted into mechanical package buck data, transmitted to the mechanical vehicle package model system 34, and the mechanical package buck is adjusted thereby.

The method 40 of FIG. 2 also illustrates at block 42 that the vehicle package buck data may be modified. Referring again to FIG. 1, these modifications may be received from the input data 22 or from communication line 38 as a result of appraisal data derived from the output data 28. Once the vehicle package buck data is modified, it is converted into mechanical package buck data in block 44 and is transmitted to the mechanical package buck system 34 at block 46. Thus, adjustments made to the virtual vehicle package model 30 are simultaneously adjusted to the mechanical package buck at block 48.

Figure 3:
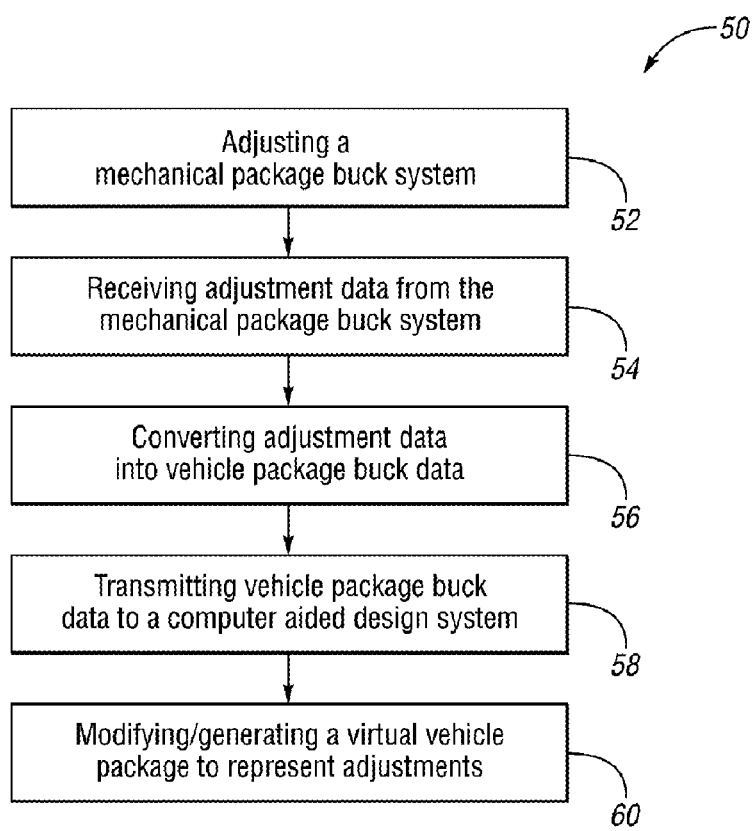
FIG. 3 is a flow chart illustrating another method for designing a vehicle package in accordance with the present invention.

With reference now to FIG. 3, another computer implemented method for rapidly designing a vehicle package is illustrated in block diagram form and is referenced generally by numeral 50. The method 50 of FIG. 3 may be utilized in series with the method 40 of FIG. 2 or separate as illustrated. Of course, both methods 40, 50 of FIGS. 2 and 3 may be used multiple times alone or in combination during the development of the vehicle package through the system 20 of FIG. 1. Therefore, whether both methods 40, 50 are utilized and the number of times each method 40, 50 is repeated depends on the number of design inputs and modifications that are undergone during the vehicle package development.

At block 52, the mechanical buck system 34 is adjusted to represent the vehicle package. In block 54, the adjustment data is received from the mechanical package buck system 34. In block 56, the adjustment data is converted into vehicle package buck data. In block 58, the vehicle package buck data is transmitted to the software, or a computer aided design system. In block 60, a virtual vehicle package may be created from the data, such as the virtual vehicle package model 30. If the virtual vehicle package model 30 has already been generated, then the model 30 is modified to represent the adjustments.

Thus, with reference to FIG. 1 modifications made to the hardware 26 are conveyed through communication line 36 to the software 24 for simultaneous adjustment of the virtual vehicle package model 30 concurrently with the programmable mechanical vehicle package model system 34.

After modifications are made to a virtual vehicle package, a virtual analysis may be conducted to determine if the virtual vehicle package meets certain design criteria such as specifications or regulations. If so, the vehicle package development may proceed to a subsequent stage. If not, further adjustments may be made to the virtual vehicle package. Accordingly, these changes may be made simultaneously to the mechanical package buck. Once changes are made to the virtual vehicle package, further virtual analysis may be conducted to verify that the virtual vehicle package meets the design criteria. If so, the mechanical package buck may be adjusted at this stage if not adjusted already. Thus, multiple iterations of design changes may be implemented and validated efficiently during virtual analysis.

When the vehicle package is validated physically, it may be tested for marketability and ergonomics. Physical studies are conducted to assess the marketability and/or ergonomics of the vehicle package. Subsequent to conducting physical studies, a determination is made whether design changes are requested. If so, the design changes are implemented to modify the vehicle package buck data at block 42 which consequently adjusts the mechanical package buck at block 48. The design changes may be a change in a dimension, which is subsequently reflected electronically in the software 24 and/or physically in the hardware 26.

If design changes are requested as a result of conducting physical studies, the mechanical package buck system may be adjusted at block 52, thereby adjusting the mechanical package buck and subsequently modifying the virtual vehicle package in block 60. The physical studies may be marketing studies with target audience test groups to determine whether the vehicle package suits the target audience. Alternatively, the physical studies may be ergonomics test for maximizing the comfort and use of space and features within the mechanical buck. The step of inputting design requests as a result of physical studies is illustrated by the communication line 38 in FIG. 1, wherein the input criteria 22 to the system 20 is modified by communication line 38. Once adjustments are made, the step of conducting physical studies may be repeated until design changes are no longer required.

Another advantage of maintaining the software and hardware in loop during multiple iterations of design changes is to monitor the history of design changes to ensure that past designs, which did not survive validation, are not revisited. Therefore, unnecessary steps may be eliminated due to monitoring of the hardware 26 by the software 24.

If design changes are not requested, vehicle buck data may be exported for at least one vehicle component. That vehicle package buck data may be evaluated. This evaluation may include engineering studies for the engineering development of the given component. Alternatively, after the vehicle package buck data for a vehicle component is exported, the vehicle component may be fabricated. This fabrication may include prototype fabrication. This fabrication may also include fabrication of a buck insert, which may be added to the mechanical package buck for conducting further physical studies with a prototype buck component rather than a generic buck component. After the vehicle component is evaluated, the engineered component may be fabricated.

Likewise, the vehicle component may be evaluated, by engineered development, research and development, or the like. Subsequently, the vehicle component may be fabricated. The fabricated vehicle component may be a prototype such as a vehicle package specific buck insert, or may be a final component. If the component is a buck panel insert, the component may be mounted to the mechanical buck and physical studies may be repeated. Once the vehicle package buck data is exported, the vehicle component may be directly fabricated.

Further down the development stage, once a design package has been finalized, data may be exported for design of production components. The data may be exported for product engineering, finite element analysis, or the like.

Figure 4:
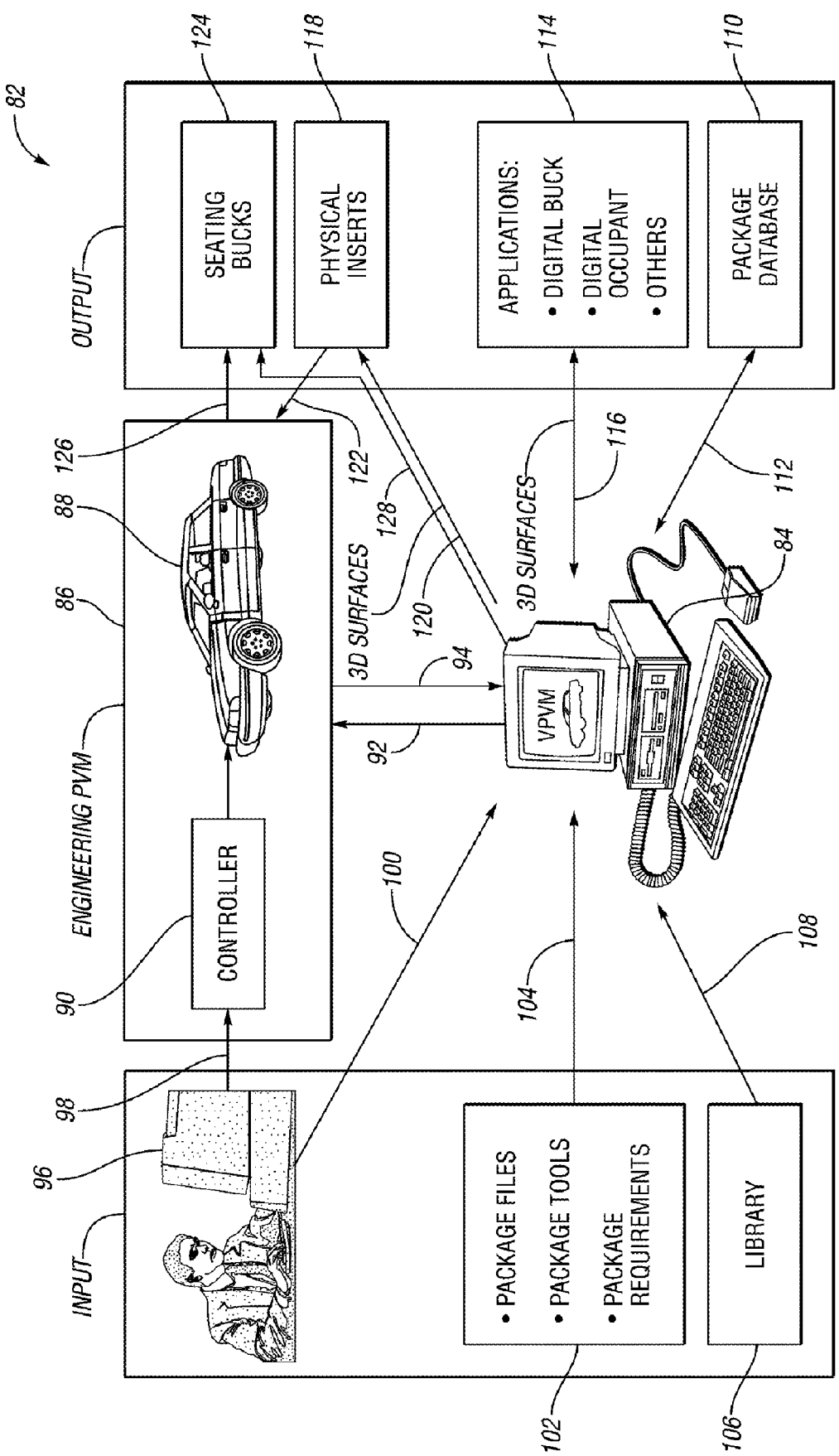
FIG. 4 is a schematic for a system and method for rapidly designing a vehicle package in accordance with the present invention.

FIG. 4 illustrates a vehicle package development system 82 in accordance with the present invention. The system 82 includes both software 84 and hardware 86 for developing a vehicle package. The software 84 is a computer aided design system that includes the virtual vehicle package model, also known as the virtual vehicle buck, or the virtual programmable vehicle model (VPVM).

The hardware 86 is a mechanical vehicle package model, also known as a programmable vehicle model (PVM). The PVM 86 includes a mechanical vehicle model or mechanical buck 88 that includes automation equipment that is controlled by controller 90.

The PVM 88 may include generic physical inserts that may be adjusted to various sizes or locations. Alternatively, vehicle package specific inserts may be fabricated and mounted to the adjustable buck for validating a particular design.

The PVM 88 has many adjustable components that may be adjustable in size and location. For example, the PVM 88 has adjustable interior components. Thus, when many of these components are referred to as adjustable, the location of the component may be adjusted relative to a reference point, such as the occupant. Additionally, the occupant may be adjusted. The overall size of the component may be adjusted. The angle of the component may be adjusted. For components that are adjustable in size such as roof, hood, deck lid, doors, panels and pillars, these components may be extendable and retractable in one or more directions of translation for adjusting the size. Such adjustability has been disclosed in the prior art such as in the Doll et al. U.S. Pat. No. 6,371,766 B1, which has been incorporated by reference herein.

The invention contemplates that any adjustable buck may be utilized in the system 82 in accordance with the present invention. The PVM 86 may be utilized for testing and validating various exterior and interior components. Alternatively, the PVM may be an engineering PVM that includes many interior components and a reduced exterior, which may include a hood, roof and pillars but may omit many of the exterior body panels.

The PVM 86 may include adjustable components including an accelerator pedal, a brake pedal, a clutch pedal, a console, an instrument panel, a rocker, seats, a shift handle, a steering column and a steering wheel. The PVM 86 may also include multiple adjustable interior panels including floor panels, a headliner, door inner trim panels, pillars, scuff plates and the like. The PVM 86 may also include multiple adjustable exterior panels such as a hood, a roof, door panels, front and rear quarter panels, a deck lid, front and rear bumpers, a grill, and the like.

Either the CAD system 84, the controller 90 or both may include a converter or translator embodied in a computer system for converting virtual vehicle package model data to mechanical vehicle package model data and mechanical package vehicle model data to virtual vehicle package model data. The data is electronic and is conveyed between computers, namely the CAD system 84 and the controller 90. In the system 82 depicted in FIG. 4, the CAD system 84 performs the conversion function.

Designs or design modifications made to the VPVM and the CAD system 84 are conveyed through communication line 92 to the controller 90 and are imparted to the mechanical buck 88. For example, the CAD system 84 may convert the CAD data to a universal data format such as Extensible Markup Language (XML) data files that may be interpreted by the controller 90 for adjustment of the mechanical buck 88. Likewise, the controller 90 may export data in XML format which may be uploaded by the CAD system into the virtual vehicle buck. Similarly, changes made to the mechanical buck 88 at the controller 90 are conveyed through communication line 94 to the CAD system 84 so that the changes are automatically made to the VPVM. The CAD system 84 and PVM 86 may cooperate so that modifications are conducted simultaneously. Additionally, the CAD system 84 may operate so that the changes are simulated upon the CAD system.

The vehicle package development system 82 includes a graphical user interface (GUI) 96. An operator may input design changes into the GUI 96 that are conveyed through communication lines 98, 100 to the controller 90 and CAD system 84 respectively for imparting a design change to both the PVM 86 and the VPVM and the CAD system 84. Other inputs may be provided to the CAD system 84 such as input criteria 102. The input criteria 102 may include package files, output from tools, package requirements or the like, which may be driven by data that is specific for the vehicle package. The input criteria 102 is input to the CAD system 84 via communication line 104.

The input also includes a library 106. The library 106 includes components and sections of various components such as various generic components, wherein the user may select one of a series of generic component sections and modify it to the size required for the given vehicle package. Data is transferred from the sections library 106 to the CAD system 84 through communication line 108.

The output of the system 82 is exported into a vehicle package database 110 from the CAD system 84 via communication line 112. The package database 110 is utilized for developing the resultant vehicle. As engineering, analysis, validation and other developmental processes are conducted on the package database 110, changes or modifications, if required, may be input back into the CAD system 84 through communication line 112 for modifying the VPVM and the mechanical buck 88 for assessment and validation of the design changes.

The output also includes applications 114 such as, a digital buck and digital occupant analysis. Three-dimensional (3D) surfaces are conveyed through communication line 116 to the applications 114 for conducting the studies, such as a digital occupant's access to various components within a digital buck and the digital occupant's ability to view externally out of the vehicle. The output from such applications are limitations or specifications which are often referred to as design zones and cones. If any modifications are required based on the appraisals using the applications 114, the modified three-dimensional surfaces may be conveyed through communication line 116 back to the CAD system 84, and the appropriate modifications are made to the VPVM and the mechanical buck 88.

Another output may include physical inserts 118. Three-dimensional surfaces are exported through communication line 120, which are subsequently fabricated into physical inserts 118. The physical inserts 118 may be added to the mechanical buck 88 as illustrated by communication line 122 so that a package specific physical insert 118 may be assessed within the mechanical buck 88, rather than assessment of a generic adjustable component.

Another output may include any phase of mechanical buck such as seating bucks 124. The seating bucks 124 may be developed from data exported from the PVM 86 via communication line 126 or from the VPVM of the CAD system 84 from communication line 128.

Figure 5:
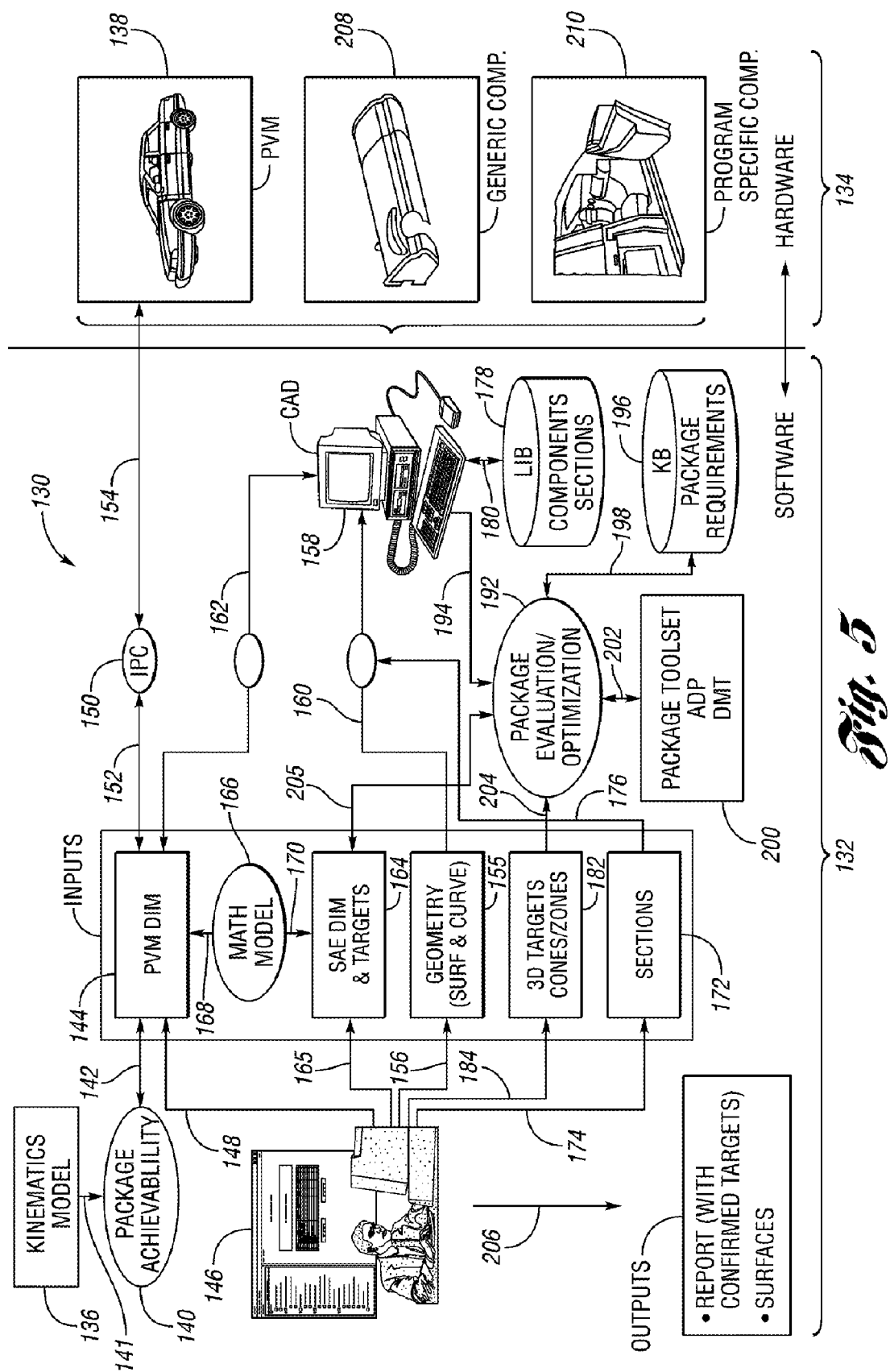
FIG. 5 is another schematic of a system and method for rapidly designing a vehicle package in accordance with the present invention.

Referring now to FIG. 5, architecture for a vehicle package development system 130 is illustrated in accordance with the present invention. The architecture for the system 130 is illustrated for both software 132 and hardware 134.

A graphical user interface (GUI) 146 is provided by the software 132. The GUI 146 contains PVM dimensions 144 via communication line 148. The GUI 146 permits an operator to manipulate the PVM dimensions 144.

Figure 6:
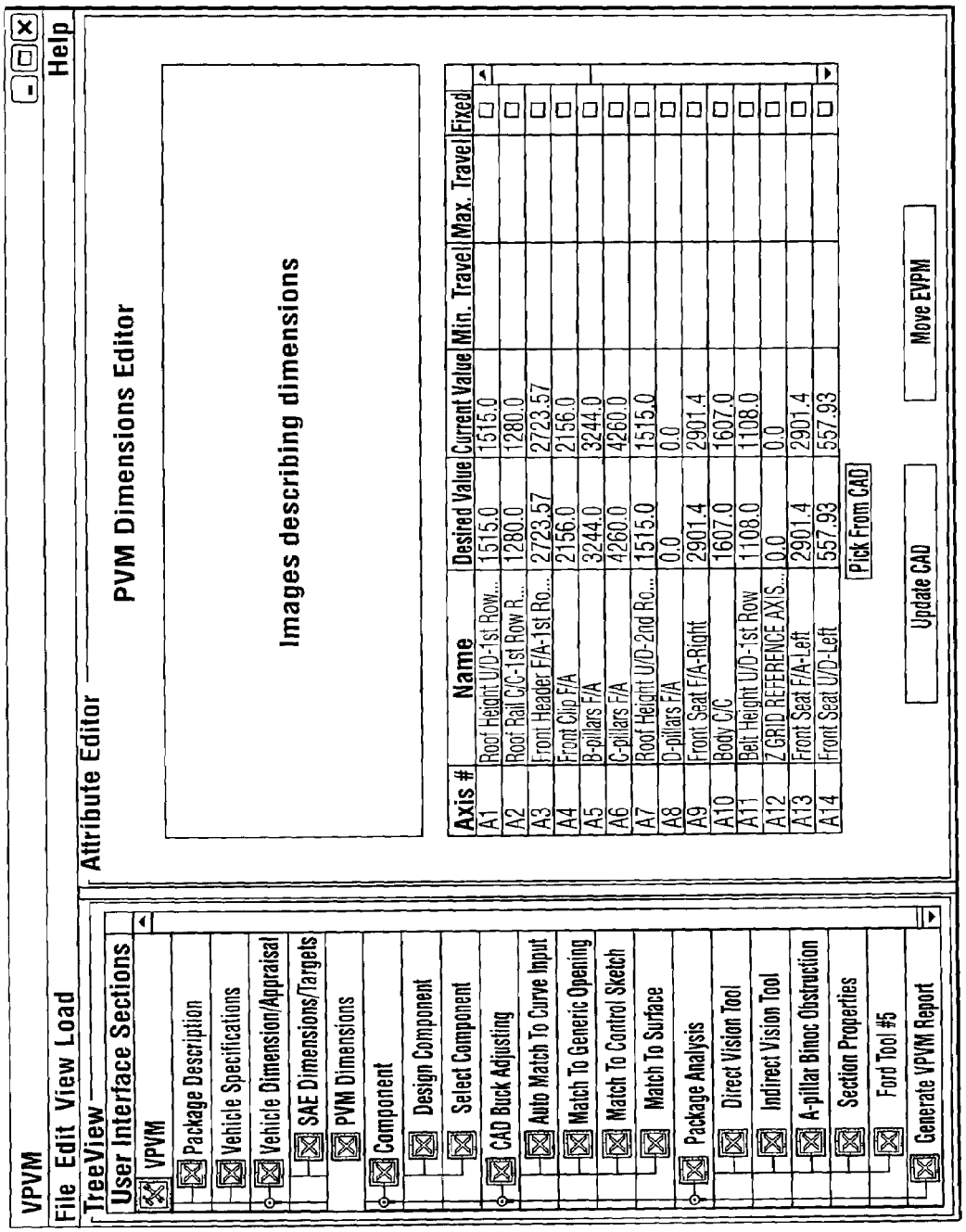
FIG. 6 is an exemplary screen shot from a computer aided design system in accordance with the present invention.

Referring now to FIG. 6, an exemplary screen shot is illustrated of the GUI 146. The GUI 146 is illustrated displaying a PVM dimensions editor. Accordingly, a user or operator may manually input adjustments into the PVM dimensions editor at the GUI 146 for various vehicle package components, such as those displayed in FIG. 6.

Referring again to FIG. 5, the software 132 includes a kinematics model 136 for an associated PVM 138 of the hardware 134. The kinematics model 136 is generally a stick wire diagram that captures the potential range of motion and control of the hardware for the PVM 138. The kinematics model 136 provides a design guide for a range of motion during the PVM 138 design and build phase. Based on the kinematics model 136, a package achievability function 140 is built to determine if the PVM 138 spans the range of motion required by the package input in PVM dimensions 144. The package achievability 140 communicates with the kinematics model via communication line 141. For example, the package achievability 140 may be a mathematic prediction model that determines offsets required for various component panels and determines whether the PVM 138 can satisfy the required range of translations. The package achievability 140 factors in the target vehicle package, the kinematics model 136, sizes of components and desired positions.

If a particular PVM, such as the PVM 138 does not satisfy the package achievability 140, the PVM 138 may be substituted with another PVM having adequate ranges of dimensions and components. Alternatively, the PVM 138 may be altered and modified to meet the package achievability 140.

Once the package achievability 140 has been verified with the kinematics model 136 for the PVM 138, corresponding data is input into the software 132 via communication line 142. The data from the package achievability 140 may be in the form of the PVM dimensions 144. The PVM dimensions 144 may be three dimensional data for adjusting the PVM 138.

The GUI 146 contains the PVM dimensions modifications via communication line 148. The PVM dimensions 144 are in communication with an inter-process communication (IPC) 150, which transmits the PVM dimensions 144 for adjusting the PVM 138. The IPC 150 is in bidirectional communication with the PVM dimensions 144 via communication line 152.

The IPC 150 is in bidirectional communication with the hardware 134. Specifically, the IPC 150 is in bidirectional communication with the PVM 138 via communication line 154. Thus, as the PVM dimensions 144 are modified, the IPC 150 conveys this information to the PVM 138. Likewise, as adjustments are made at the PVM 138, these adjustments are conveyed to the IPC 150, which converts the data and correspondingly adjusts the PVM dimensions 144.

The GUI 146 is utilized for inputting a geometry 155 into the software 132. The geometry 155 is conveyed from the GUI 146 via communication line 156 to a CAD system 158 via communication line 160. The GUI 146 and the CAD system 158 may be provided within a common computer. The CAD system 158 maintains a virtual vehicle model, or virtual programmable vehicle model (VPVM) that represents the mechanical buck or PVM 138. The CAD system 158 is in bidirectional communication with the PVM dimensions 144 via communication line 162. The CAD system 158 may maintain the VPVM simultaneously with the PVM 138.

The GUI 146 may be utilized for inputting industry standard dimensions, targets and specifications, such as SAE dimensions and targets 164 via communication line 165. A math model 166 is provided to map the PVM dimensions 144 and the SAE dimensions and targets 164 through communication lines 168, 170 respectively. The math model 166 maps the PVM dimensions 144 with SAE dimensions and targets 164 for a given vehicle style. Such SAE dimensions may be provided by Surface Vehicle Recommended Practice such as that disclosed in SAE J1100, rev. July 2002, which is incorporated in its entirety by reference herein.

The PVM dimensions 144 are generally independent from each other and have linear or angular directions of movement or translation. The SAE dimensions and targets 164 may or may not be independent of one another and may be provided in linear and/or angular dimensions.

Vehicle programs often use SAE dimensions or other specifications as targets. For example, SAE dimensions may be provided for North American packaging input or any other region-specific packaging input. Accordingly, the math model 166 provides a mathematical relationship between the PVM dimensions 144 and the SAE dimensions and targets 164. The math model 166 may be utilized to map between the PVM dimensions 144 and the SAE dimensions or other targets 164.

An illustration in chart format of mapping and interactions between the PVM dimensions 144 and the SAE dimensions and targets 164 is illustrated by way of non-limiting example in chart 1 below. Chart 1 illustrates how the math model 166 may organize and compare PVM components with specifications and parameters, such as SAE parameters.

CHART 1

| PVM | PVM description | SAE Parameters Influenced |
|---|---|---|
| A1 | Roof Rail Width | Tumble-home (W122) |
| A2 | Shoulder Room | Vehicle width (W103) |
|  |  | Hip room front and rear (W20) |
|  |  | Shoulder room - front (W3) |
|  |  | Shoulder room - second (W4) |
| A3 | Headliner | Vehicle height (H101) |
|  |  | Backlight slope angle (H121) |
|  |  | Windshield slope angle (H122) |
|  |  | Tumble-home (W122) |
|  |  | Effective Head room - front (H61) |
|  |  | Minimum head clearance (H41) |
|  |  | Head clearance diagonal driver - 30 degrees (W27) |
|  |  | Head clearance lateral driver (W35) |

CHART 1-continued

| PVM | PVM description | SAE Parameters Influenced |
|---|---|---|
| | | Head clearance minimum driver (W38) |
| | | Binocular vision (WCR) |
| | | Wheelbase (L101) |
| | | Vehicle length (L103) |
| | | Upper structure length (L123) |
| A4 | Front Clips | Windshield slope angle (H122) |
| | | SgRP - front "X" coordinate (L31) |
| A5 | B-pillar F/A | Wheelbase (L101) redistribution |
| A6 | Rear clip | Wheelbase (L101) |
| | | Vehicle length (L103) |
| | | Rear wheel centerline to second SgRP (L115) |
| | | Upper structure length (L123) |
| | | Backlight slope angle (H121) |
| A7 | Front Headliner | Windshield slope angle (H122) |

The GUI 146 may be utilized for inputting sections 172 via communication line 174 into the software 132. The sections 172 may be conveyed to the CAD system 158 via communication line 176. Alternatively or concomitantly, the CAD system 158 may include a library 178 of components and sections. The CAD system 158 communicates with the sections library 178 via bidirectional communication line 180 so that sections, such as sections 172 may be added to the library 178 via communication line 180; and various sections and components may be retrieved from the library 178 by the CAD system 158 through the communication line 180. Components may be stored for reuse in subsequent program development. The GUI 146 is also utilized for inputting three-dimensional targets such as cones and zones 182 via communication line 184.

Figure 7:
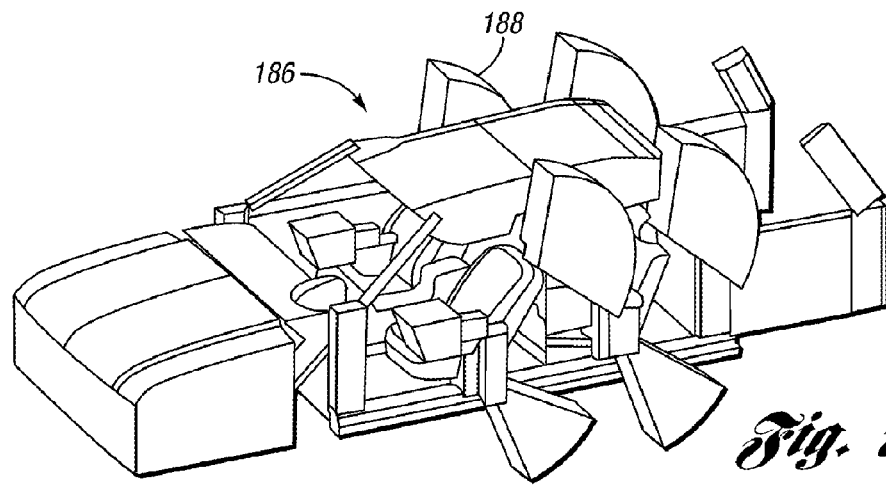
FIG. 7 is an exemplary illustration of a virtual vehicle package model in accordance with the present invention.
Figure 8:
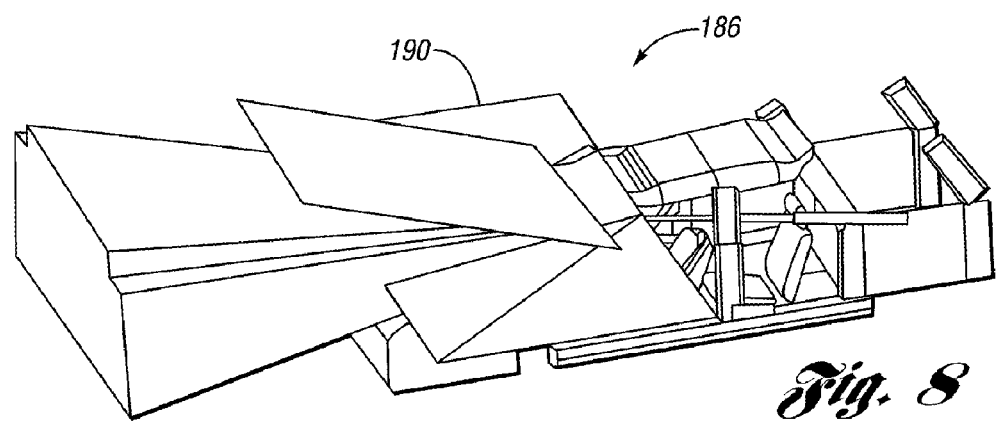
FIG. 8 is an exemplary illustration of a virtual vehicle package model in accordance with the present invention.

With reference now to FIGS. 7 and 8, the virtual vehicle package model or VPVM is illustrated and referenced generally by numeral 186. The VPVM 186 is illustrated in both FIGS. 7 and 8 as screen shots generated by the CAD system 158 and viewable on the CAD system 158. In FIG. 7, a plurality of zones 188 are illustrated corresponding with the VPVM 186. The zones 188 are dimensional ranges derived from the package targets or requirements and are represented in CAD format on the CAD system 158. The zones 188 represent design areas to use for design, or to avoid designing within. The zones 188 are utilized to illustrate ranges within the VPVM 186 for virtual illustrative purposes. Such visualizations, as well as virtual and computer analysis, generally streamline the development of the vehicle package and may be utilized for minimizing the amount of actual testing required in the PVM 138.

With reference now to FIG. 8, the VPVM 186 is illustrated with a plurality of cones 190. The cones 190 are used to represent angular requirement ranges such as an occupant's range of vision and may be useful for designing the placement of the occupant, vehicle pillars, the roof, the hood or other panels and components.

With reference again to FIG. 5, package evaluation and optimization 192 is conducted virtually within the software 132. The package evaluation/optimization 192 receives data from the CAD system 158 through communication line 194, package requirements 196 via communication line 198, package toolset data 200 (such as Automatic Design Process (ADP) and Dimension Measurement Tool (DMT)) via communication line 202, and the 3D targets 182 via communication line 204. The package evaluation/optimization 192 takes this information into consideration for providing virtual evaluation and optimization 192 of the VPVM 186.

Additionally, design issues such as interferences, blind spots and the like may be identified and omitted at the software package evaluation/optimization 192 thereby saving time assessing the hardware 134. Further, the package evaluation/optimization may communicate, via communication line 205, with the SAE dimensions and targets 164 for virtual analysis and validation of the vehicle package.

During the development of the vehicle package, the GUI 146 may export output data for at least one component of the vehicle package via communication line 206. The output may be utilized for reporting confirmed targets and for development of component surfaces and designs.

The PVM 138 may utilize generic components 208 for representing a plurality of vehicle package styles and shapes. Alternatively, if a specific vehicle package is to assessed, the output data from the GUI 146 for specific components may be utilized to fabricate program specific components 210 which may be utilized with the PVM 138 before the program specific components 210 are finalized and ready for engineering and subsequent manufacturing.

Figure 9:
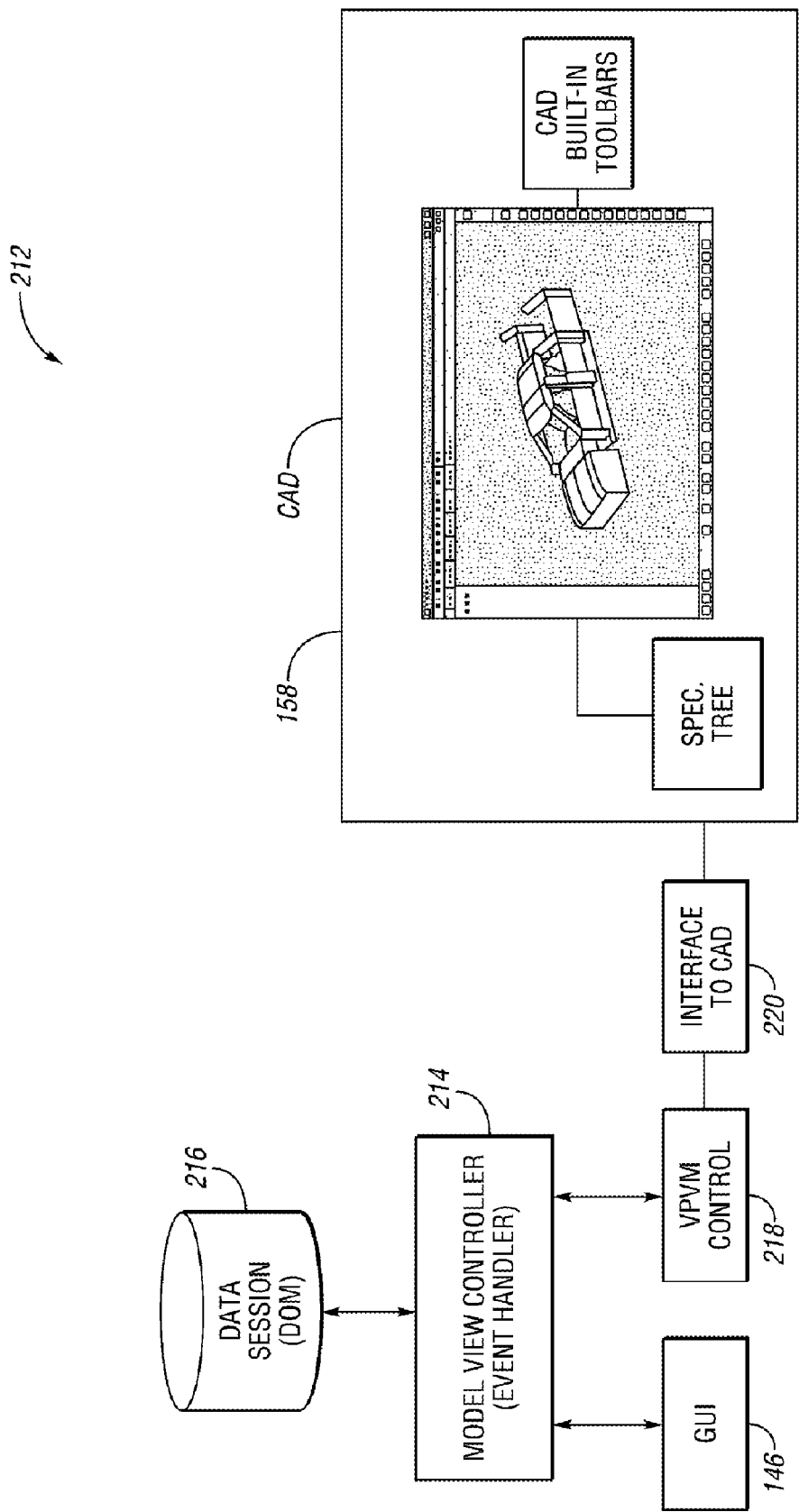
FIG. 9 is a schematic of an interfacing protocol for a system and method for rapidly designing a vehicle package in accordance with the present invention.

With reference now to FIG. 9, an exemplary interfacing protocol 212 is illustrated for utilization with the system of the present invention. The GUI 146 is illustrated in communication with a model view controller 214. The model view controller 214 communicates with data session 216. The data session 216 may be a document object model (DOM). The model view controller 214 is an event handler that also communicates with a VPVM control 218. The VPVM control 218 communicates with the CAD system 158 via an interface to CAD 220.

The interfacing protocol 212 permits the operator to interact with the system via the GUI 146. Thus, adjustments to the VPVM that are imparted through the GUI 146 are conveyed through the model view controller 214 through the VPVM control 218 through the interface to CAD 220 to the CAD system 158; and are concurrently conveyed to the data session 216 through the model view controller 214.

Figure 10:
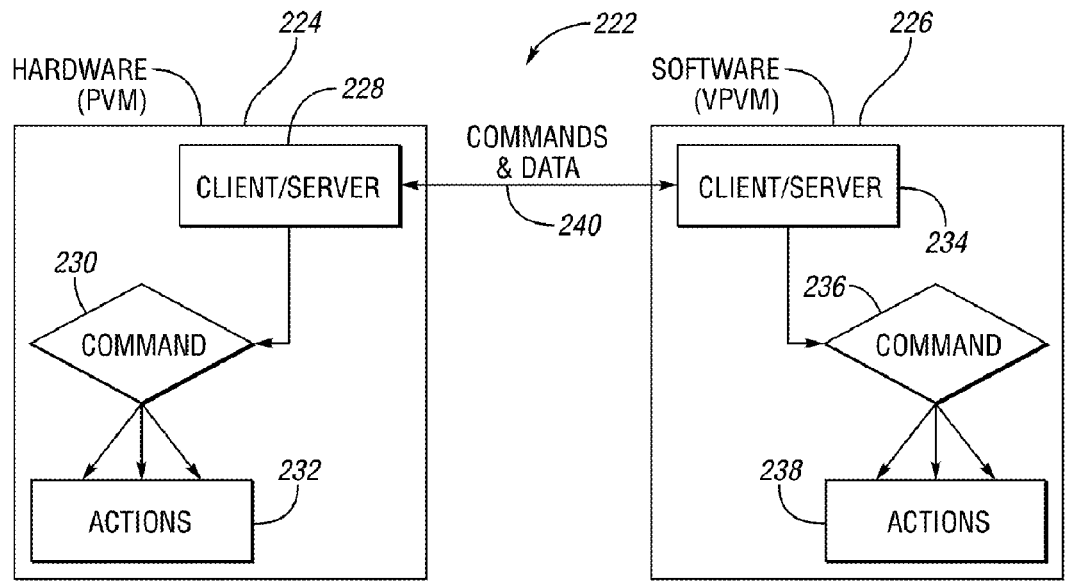
FIG. 10 is a schematic of a communication protocol for a system and method for rapidly designing a vehicle package in accordance with the present invention.

With reference now to FIG. 10, an exemplary communication protocol 222 is illustrated in accordance with the present invention. The communication protocol 222 includes both hardware 224 having a PVM and software 226 having a VPVM. The hardware 224 includes a client or server 228 that is utilized for transmitting commands 230 which are converted into actions 232 by the PVM.

Likewise, the software 226 includes a client or a server 234 that conveys commands 236 which are converted into actions 238 by the VPVM. The hardware client/server 228 and the software client/server 234 are in bidirectional communication with one another via communication line 240. Thus, commands and data from each client/server 228, 234 are conveyed between the hardware 224 and the software 226 for maintaining simultaneous adjustments between the PVM and the VPVM.

In summary, the systems and methods of the present invention may be used to establish vehicle package program targets, study different vehicle package model alternatives, identify potential vehicle package issues, and perform tradeoffs between vehicle package, functionality and style. By putting the hardware in direct communication with the software, the hardware is in the loop with the virtual buck and therefore modifications required at the physical buck may be directly conveyed and subsequently analyzed by the software. Such systems and methods may: reduce the amount of time required in developing the vehicle package, provide accurate vehicle package and ergonomic studies, reduce designer and engineer time, enable early package analysis and evaluation, reduce evaluation time between vehicle package design and testing, improve the efficiency of utilizing mechanical bucks or PVMs, minimize operator errors from inputting validation data, eliminate intermediate hardware components such as seating buck builds, enable early appraisal and feedback from real time human appraisal that is directly fed back to the VPVM, and provide design geometry to other analysis tools for engineering evaluation and manufacturing evaluation.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A computer-implemented method for rapidly designing a vehicle package for a vehicle, wherein the vehicle package includes at least the dimensions and locations of one or more vehicle components, comprising:

modifying virtual vehicle package model data with the computer aided design system; and limiting the virtual vehicle package model data modifications to a range of predefined vehicle package dimensions, the range being dependent on the design of the vehicle and the vehicle package;

receiving the virtual vehicle package model data for the vehicle package from a computer aided design system;

converting the virtual vehicle package model data into mechanical vehicle package model data readable by a mechanical vehicle package model system for adjusting a mechanical vehicle package model;

transmitting the mechanical vehicle package model data to the mechanical vehicle package model system, wherein the mechanical vehicle package model is adjusted based on the mechanical vehicle package model data.

2. The method of claim 1 further comprising conducting marketing studies of the mechanical vehicle package model to assess the vehicle package.

3. The method of claim 1 further comprising conducting physical studies of the mechanical vehicle package model to assess the vehicle package.

4. The method of claim 3 further comprising adjusting the mechanical vehicle package model to obtain an adjusted mechanical vehicle package model and assessing the adjusted mechanical vehicle package model.

5. The method of claim 3 further comprising:

inputting adjustment data into the mechanical vehicle package model system to adjust at least one of the one or more vehicle components;

adjusting at least one of the one or more vehicle components; and converting the adjustment data into virtual vehicle package model modification data readable by the computer aided design system.

6. The method of claim 5 further comprising transmitting the virtual vehicle package model modification data to the computer aided design system.

7. The method of claim 6 further comprising modifying a virtual vehicle package model to represent the adjustments made to the mechanical vehicle package model.

8. A computer-implemented method for rapidly designing a vehicle package for a vehicle, wherein the vehicle package includes at least the dimensions and locations of one or more vehicle components, comprising:

receiving virtual vehicle package model data for a vehicle package from a computer aided design system;

converting the virtual vehicle package model data into mechanical vehicle package model data readable by a mechanical vehicle package model system for adjusting a mechanical vehicle package model;

transmitting the mechanical vehicle package model data to the mechanical vehicle package model system, wherein the mechanical vehicle package model is adjusted based on the mechanical vehicle package model data;

modifying the virtual vehicle package model data with the computer aided design system;

limiting the virtual vehicle package model data modifications to a range of predefined vehicle package dimensions, the range being dependent on the design of the vehicle and the vehicle package;

converting the modified virtual vehicle package model data into modified mechanical vehicle package model data readable by the mechanical vehicle package model system for adjusting the mechanical vehicle package model; and transmitting the modified mechanical vehicle package model data to the mechanical vehicle package model system, wherein the mechanical vehicle package model is adjusted based on the modified mechanical vehicle package model data.

9. A computer-implemented method for rapidly designing a vehicle package for a vehicle, wherein the vehicle package includes at least the dimensions and locations of one or more vehicle components, comprising:

modifying virtual vehicle package model data with the computer aided design system; and limiting the virtual vehicle package model data modifications to a range of predefined vehicle package dimensions, the range being dependent on the design of the vehicle and the vehicle package;

receiving the virtual vehicle package model data for the vehicle package from a computer aided design system;

converting the virtual vehicle package model data into mechanical vehicle package model data readable by a mechanical vehicle package model system for adjusting a mechanical vehicle package model;

transmitting the mechanical vehicle package model data to the mechanical vehicle package model system, wherein the mechanical vehicle package model is adjusted based on the mechanical vehicle package model data;

receiving the adjustment data from the mechanical vehicle package model system for at least one of the one or more vehicle components; and converting the adjustment data into virtual vehicle package model modification data readable by the computer aided design system.

10. The method of claim 9 further comprising:

transmitting the virtual vehicle package model modification data to the computer aided design system; and modifying a virtual vehicle package model using the virtual vehicle package model modification data to represent the adjustments made to the mechanical vehicle package model.

11. The method of claim 10 wherein the virtual vehicle package model modifications and the adjustments to the mechanical vehicle package model are sequential.

12. The method of claim 10 further comprising storing the virtual vehicle package model data for at least one vehicle component in a computer readable medium.

13. The method of claim 12 further comprising evaluating at least one vehicle component from the virtual vehicle package model data.

14. The method of claim 12 further comprising fabricating the at least one vehicle component from the virtual vehicle package model data.

15. A computer-implemented method for rapidly designing a vehicle package for a vehicle, wherein the vehicle package includes at least the dimensions and locations of one or more vehicle components, comprising:
- adjusting a mechanical package buck to represent the vehicle package;
- converting the adjustments into virtual vehicle package buck modification data readable by a computer aided design system;
- transmitting the virtual vehicle package buck modification data to the computer aided design system; and
- generating a virtual vehicle package in the computer aided design system to represent the mechanical package buck.

16. The method of claim 15 further comprising:
- storing the virtual vehicle package model data for at least one vehicle component in a computer readable medium.

17. The method of claim 16 further comprising:
- evaluating at least one vehicle component from the virtual vehicle package model data.

18. A computer-implemented system for rapidly designing and validating a vehicle package for a vehicle, wherein the vehicle package includes at least the dimensions and locations of one or more vehicle components comprising:

- an adjustable mechanical vehicle package model for configuring a plurality of vehicle packages having one or more vehicle components;
- a computer aided design system having virtual vehicle package model data for a vehicle package, the computer aided design system being configured to receive instructions for modifying the virtual package model data of the vehicle package and to limit the virtual vehicle package model data modifications to a range of predefined vehicle package dimensions;
- a translator embodied in a computer system in communication with the computer aided design system for translating the virtual vehicle package model data into mechanical vehicle package model data; and
- a mechanical vehicle package model system in communication with the translator for reading the mechanical vehicle package model data, the mechanical vehicle package model system being in communication with the mechanical vehicle package model for adjusting the mechanical vehicle package model to represent the virtual vehicle package model data.

* * * * *